United States Patent
Haselby et al.

(12) 
(10) Patent No.: US 6,299,460 B1
(45) Date of Patent: Oct. 9, 2001

(54) SPRING-LOADED BACKING PLATE ASSEMBLY FOR USE WITH LAND GRID ARRAY-TYPE DEVICES

(75) Inventors: Jeffrey T. Haselby, Dallas; Eric C. Peterson, McKinney, both of TX (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/549,983

(22) Filed: Apr. 14, 2000

(51) Int. Cl.[7] ............................. H01R 12/00; H01R 1/00
(52) U.S. Cl. .................................. 439/67; 439/66
(58) Field of Search .................... 439/66, 68, 69, 439/71, 91, 591, 630, 631, 592, 67

(56) References Cited

U.S. PATENT DOCUMENTS

| | | | |
|---|---|---|---|
| 4,054,130 | * 10/1977 | Franke | 128/87 R |
| 4,445,735 | * 5/1984 | Bonnefoy | 339/17 M |
| 4,997,389 | * 3/1991 | Doumani et al. | 439/493 |
| 5,065,280 | 11/1991 | Karnezos et al. | 361/386 |
| 5,940,278 | 8/1999 | Schumacher | 361/769 |

* cited by examiner

Primary Examiner—Brian Sircus
Assistant Examiner—Chandrika Prasad

(57) ABSTRACT

A spring-loaded backing plate assembly for use with a printed circuit board, an electrical connector, and a land grid array-type device. The assembly comprises a backing plate adapted to support the printed circuit board and one or more leaf springs. A retainer assembly holds the leaf springs in a preloaded state against the backing plate and transfers compressive force from the leaf springs to the printed circuit board, electrical connector, and land grid array-type device.

17 Claims, 8 Drawing Sheets

SPRING-LOADED BACKING PLATE ASSEMBLY FOR USE WITH LAND GRID ARRAY-TYPE DEVICES

FIELD OF THE INVENTION

The present invention relates generally to electronic circuit assemblies including land grid array-type devices, and more particularly to backing plates and biasing assemblies for circuit assemblies including land grid array-type devices.

BACKGROUND OF THE INVENTION

Printed circuit boards are generally formed of a rigid dielectric material which is printed with a predetermined pattern of an electrical conductor. Printed circuit boards may be electrically connected to one or more land grid array-type devices such as an application specific integrated circuit (ASIC) or a flexible printed circuit having an array of electrically conductive pads thereon. In order to electrically connect a land grid array-type device to a printed circuit board, an electrical connector or "socket" may be disposed therebetween which has an array of electrically conductive pads on each side thereof. The electrically conductive pads may be constructed from an elastomeric material. The pads on one side of the connector abut with the pads on the land grid array-type device, and the pads on the other side of the connector abut with the electrically conductive array on the printed circuit board.

In order to maintain electrical connection between a land grid array-type device and a printed circuit board, the device and the board must be compressed together, with the electrical connector therebetween. Such an assembly 10 is shown in FIG. 1. The surfaces 12, 14, respectively, of the device 20 (an ASIC being shown in this figure) and the board 22 that the electrical connector 24 is in between must each be flat to within a few mils of an inch. When pads 26, 28 (shown greatly enlarged for illustrative purposes) on an electrical connector 24 are compressed between a land grid array-type device 20 and a printed circuit board 22, these pads 26 (especially elastomeric ones) act as miniature springs, exerting forces "F0" opposing the compression of the device 20 and the board 22. Existing large-area connector arrays generate large forces between the printed circuit board and the device being attached to the board. These forces are often large enough to deflect the printed circuit board outside of the flatness requirements. Thus, in addition to needing a relatively large compressive force to maintain contact between the device, the connector and the board, a backing plate 30, FIG. 1, is required to support the printed circuit board 22 and maintain the flatness of the front surface 14 thereof. As shown in FIG. 1, such a backing plate 30 is usually positioned on the back side 16 of the printed circuit board 22, opposite the electrical connector 24 and land grid array-type device 20. A second backing plate 32, which may be part of a heat sink (not shown) or the like, may be positioned adjacent to the land grid array-type device 20.

As shown in FIG. 1, a biasing assembly 34 such as springs 36, 38 are generally required to maintain a large, relatively constant force "F1" on the board, connector and device. Such a biasing assembly 34 is usually placed on the top side 14 of the printed circuit board 22, adjacent to the second backing plate 32, as shown in FIG. 1. In general, with a linear spring, the force "F" provided by a spring is directly proportional to the spring constant "K" multiplied by the linear deflection "X" (F=KX). A spring having a low spring constant "K" is most desirable in this application in order to keep the spring force as consistent as possible. Specifically, manufacturing tolerances can vary among different installations. In addition, changes in environmental conditions such as temperature and creep of various components may cause the spring to deflect. Because of F=KX, a large spring constant "K" multiplied by even a small change in deflection "X" of the spring would produce a relatively large fluctuation in the force "F" provided by the spring.

Since a large force "F" is required and a low spring constant "K" is most desirable, the linear deflection "X" of any linear spring used in this application must be large. Furthermore, since a spring with more coils deflects a greater total distance than the same type of spring with fewer coils, a coil spring used in this application must be relatively long. Specifically with reference to FIG. 1, in order to provide a sufficient force "F1" to oppose the large forces "F0" generated by the pads 26 on the electrical connector 24, the length "L1" of each spring 36, 38 (shown compressed) must be relatively large. In today's small, densely-packed computers and electronics, the distance required for such springs 36, 38 may not be available on the top side 14 of a printed circuit board 22. Even if such a distance is available, providing a more compact biasing assembly is more desirable.

Thus, it is an object of the present invention to provide a backing plate assembly which includes a biasing assembly to provide a constant compressive force on a printed circuit board, electrical connector and land grid array-type device.

It is a further object of the present invention to provide a biasing assembly having a relatively low spring constant which provides a relatively large compressive force on a printed circuit board, electrical connector, and land grid array-type device, yet does not require a relatively large distance on the top or bottom side of the printed circuit board.

It is also an object of the present invention to provide a spring-loaded backing plate assembly as a single, compact unit positioned on the back side of a printed circuit board.

It is a further object of the present invention to use a simple, relatively low-cost leaf spring assembly, rather than a coil spring assembly, as the biasing assembly in a spring-loaded backing plate assembly.

It is a further object of the present invention to provide a spring-loaded backing plate assembly which provides a predetermined, constant force upon every installation thereof in a circuit assembly.

SUMMARY OF THE INVENTION

In accordance with these and other objects, the present invention is directed to a spring-loaded backing plate assembly for use with a printed circuit board, an electrical connector, and a land grid array-type device. The assembly comprises a backing plate adapted to support the printed circuit board and one or more leaf springs. The backing plate may comprise a channel portion formed by a plurality of retaining walls. A retainer assembly holds the leaf springs in a preloaded state against the backing plate and transfers compressive force from the leaf springs to the printed circuit board, electrical connector, and land grid array-type device. The retainer assembly may comprise at least one post extending laterally through openings in the backing plate and the leaf springs. A pin extending laterally through an opening in the post is adapted to retain the leaf springs on the post and against the backing plate.

The present invention is also directed to a circuit assembly comprising a printed circuit board, a land grid array-type device, and an electrical connector disposed therebetween.

The circuit assembly also comprises the spring-loaded backing plate assembly described above. The circuit assembly further comprises a connector assembly extending through the spring-loaded backing plate assembly, the printed circuit board, the electrical connector, and the land grid array-type device. The connector assembly may comprise the retainer assembly described above, as well as at least one fastener (which may be a captive screw) which is adapted to be connected to the retainer assembly. The circuit assembly may further comprise a second backing plate (which may be part of a heat sink or the like) which is adapted to support the land grid array-type device, and an insulator disposed between the land grid array-type device and the second backing plate.

A method for assembling a spring-loaded backing plate assembly is also disclosed. The method comprises the steps of placing the leaf springs on the backing plate, compressing the leaf springs against the backing plate, extending a post through the backing plate and the leaf spring, extending a pin through the post, and releasing the compression of the leaf springs.

Finally, a method for assembling a circuit assembly utilizing a spring-loaded backing plate assembly is also disclosed. The method comprises the initial steps of extending each post through the printed circuit board and aligning the land grid array-type device and the electrical connector to the printed circuit board. A second backing plate may also be aligned to the land grid array-type device. Then, the fasteners are attached to the posts, thereby transferring compressive force from the leaf springs to the printed circuit board, electrical connector, and land grid array-type device. Finally, the fasteners are tightened on the posts, thereby further compressing the board, connector and device. Prior to attaching the fasteners to the posts, the electrical connector, land grid array-type device, insulator, and second backing plate may be snapped together to form a single unit.

BRIEF DESCRIPTION OF THE DRAWINGS

Illustrative and presently preferred embodiments of the invention are shown in the accompanying drawings in which.

DETAILED DESCRIPTION OF THE INVENTION

Figure 2:
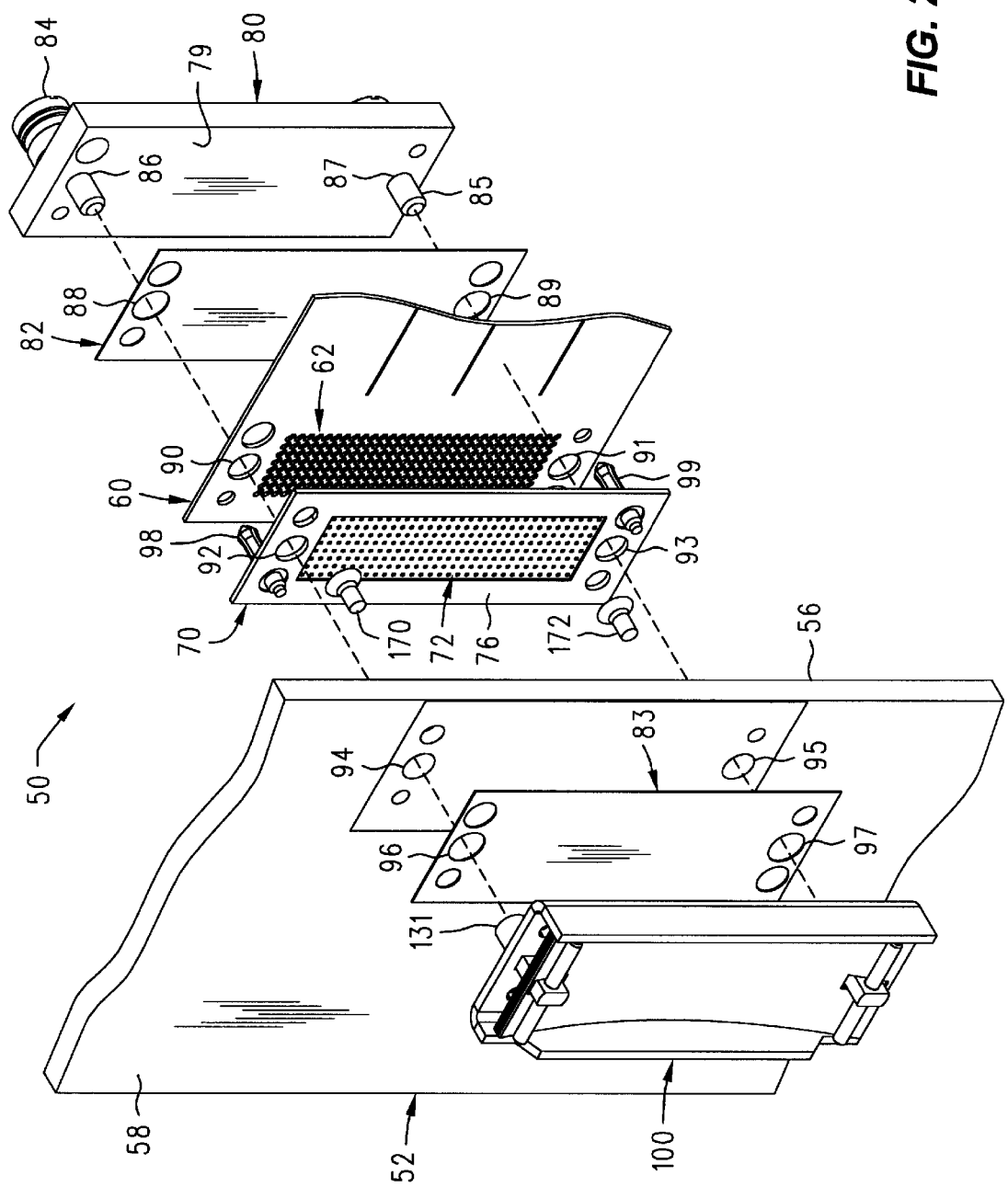
FIG. 2 is an exploded isometric view of a circuit assembly utilizing the spring-loaded backing plate of the present invention.
Figure 3:
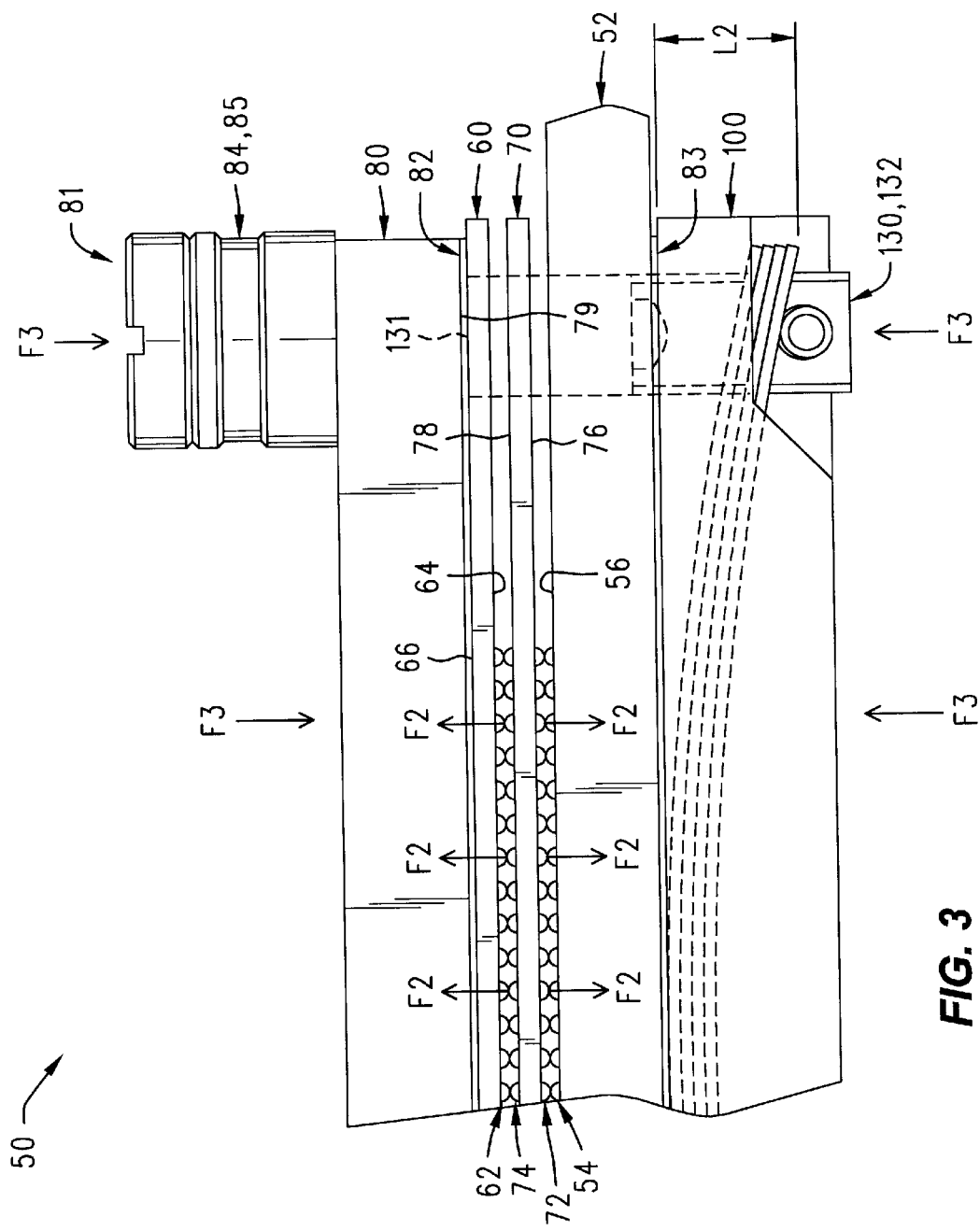
FIG. 3 is a side view of the circuit assembly of FIG. 2.

FIGS. 2 and 3 illustrate a typical circuit assembly 50 utilizing the spring-loaded backing plate assembly 100 of the present invention. The circuit assembly 50 may comprise a printed circuit board 52 with a front side 56, a back side 58 and an array 54 of electrically conductive portions (shown greatly enlarged in FIG. 3 for illustrative purposes) on the front side 56 thereof. The spring-loaded backing plate assembly 100 is positioned adjacent to the back side 58 of the printed circuit board 52 in order to provide support thereto. To assist in aligning the spring-loaded backing plate assembly 100 to the printed circuit board 52, the printed circuit board 52 may have a screen-printed outline of the spring-loaded backing plate assembly 100 on the back side 58 thereof as shown in FIG. 2.

The circuit assembly 50 may further comprise a land grid array-type device 60 which may be electrically connected to the printed circuit board 52 using an electrical connector 70. The land grid array-type device 60 may be any device such as, for example, the flex circuit shown in FIG. 2 or an ASIC, with an array 62 of electrically conductive portions (shown greatly enlarged in FIG. 3 for illustrative purposes) on the front side 64 thereof. The electrical connector 70 or "socket" may of a type well-known in the art which comprises an array 72, 74 of electrically conductive pads (shown greatly enlarged in FIG. 3 for illustrative purposes) on each side 76, 78, respectively, thereof. The electrically conductive pads 72, 74 may be constructed from an elastomeric material, although any type of socket may be used with the spring-loaded backing plate 100 of the present invention.

When assembled, the array 72 on the first side 76 of the electrical connector 70 abuts the array 54 on the front side 56 of the printed circuit board 52, and the array 74 (FIG. 3) on the second side 76 of the electrical connector 70 abuts an array 62 of electrically conductive portions on the land grid array-type device 60. As shown in FIG. 2 and described above, the pads 72, 74 (in particular, elastomeric pads) tend to create an anti-compressive force, i.e., the pads 72, 74 generate a force "F2" which push against the front sides 56, 64, respectively, of the printed circuit board 52 and the land grid array-type device 60, opposing the compression of the board 52 and device 60.

A second backing plate 80 may be included in the assembly 50 in order to support the land grid array-type device 60 on the back side 66 thereof. It should be noted that the second backing plate 80 may be comprised of any component that provides support to the device 60. For example, the second backing plate 80 may be part of a heat sink (not shown) or the like which includes a stiff plate member. As shown in FIGS. 2 and 3, an insulator 82 may be disposed between the land grid array-type device 60 and the second backing plate 80 to avoid electrical contact between the second backing plate 80 and the land grid array-type device 60. An insulator 83 may also be disposed between the spring-loaded backing plate assembly 100 and the printed circuit board 52 to avoid electrical contact therebetween. It should be noted that the second backing plate 80 may be comprised of any device which provides support to the land grid array-type device 60, such as a heat sink assembly (not shown) or the like.

In an alternate embodiment (not shown), the spring-loaded backing plate assembly 100 may be positioned adjacent to the back side 66 of the land grid array-type device 60, while the second backing plate 80 may be positioned adjacent to the back side 56 of the printed circuit board 52.

Figure 1:
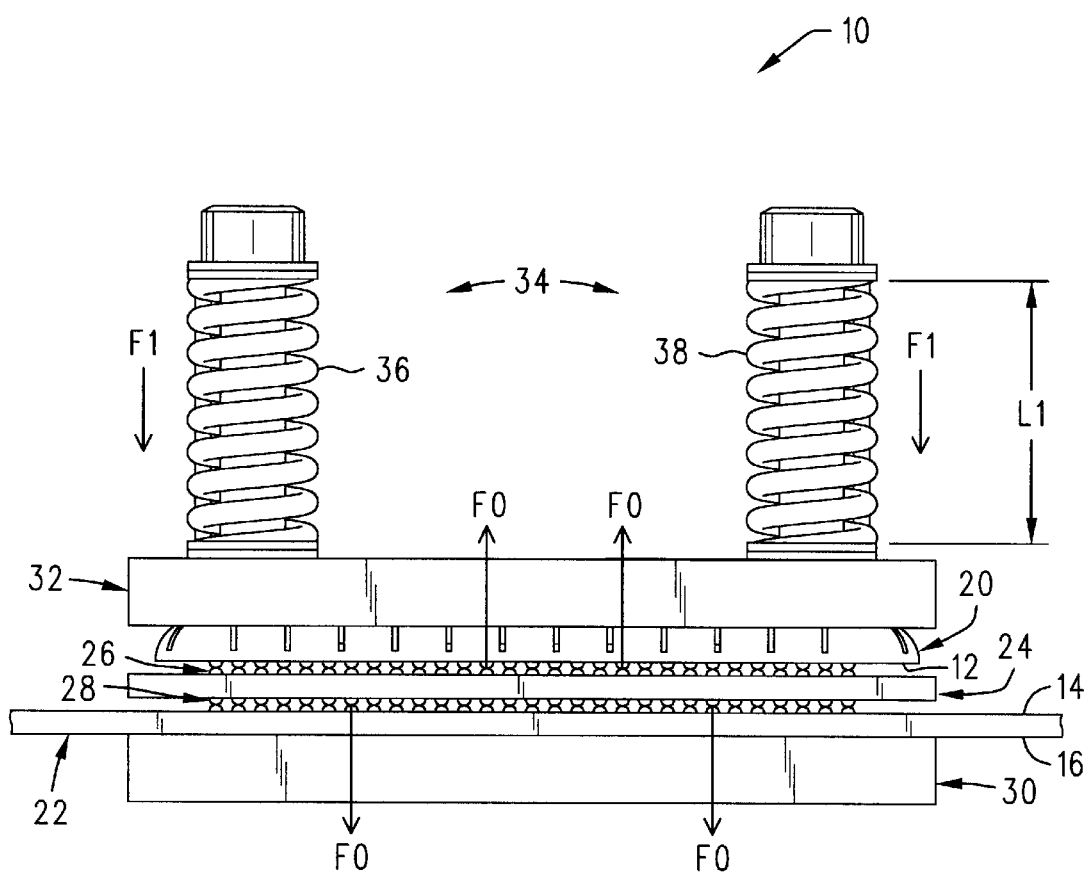
FIG. 1 is a side view of a prior art circuit assembly.

A connector assembly 81 (FIG. 3) may also be included in order to connect the spring-loaded backing plate assembly 100 of the present invention to the circuit assembly 50. The connector assembly 81 may comprise internally-threaded posts 130, 132 (which are part of the spring-loaded backing plate assembly 100 described in further detail below) and fasteners 84, 85 such as captive screws adapted to be attached to the posts 130, 132. As shown in FIG. 1, the connector assembly 81 may extend through openings 86, 87, 88, 89, 90, 91, 92, 93, 94, 95, 96, 97 (FIG. 2) in the second backing plate 80, insulator 82, land grid array-type device 60, electrical connector 70, and printed circuit board 52, and openings 110 and 112 (FIG. 4) in the spring-loaded backing plate assembly 100.

As shown in FIG. 2, the circuit assembly 50 may further comprise fasteners 98, 99 such as pronged pins or the like which are adapted to connect together the electrical connector 70, the land grid array-type device 60, the second backing plate 80 and insulator 82 prior to installing them onto the printed circuit board 52.

Figure 4:
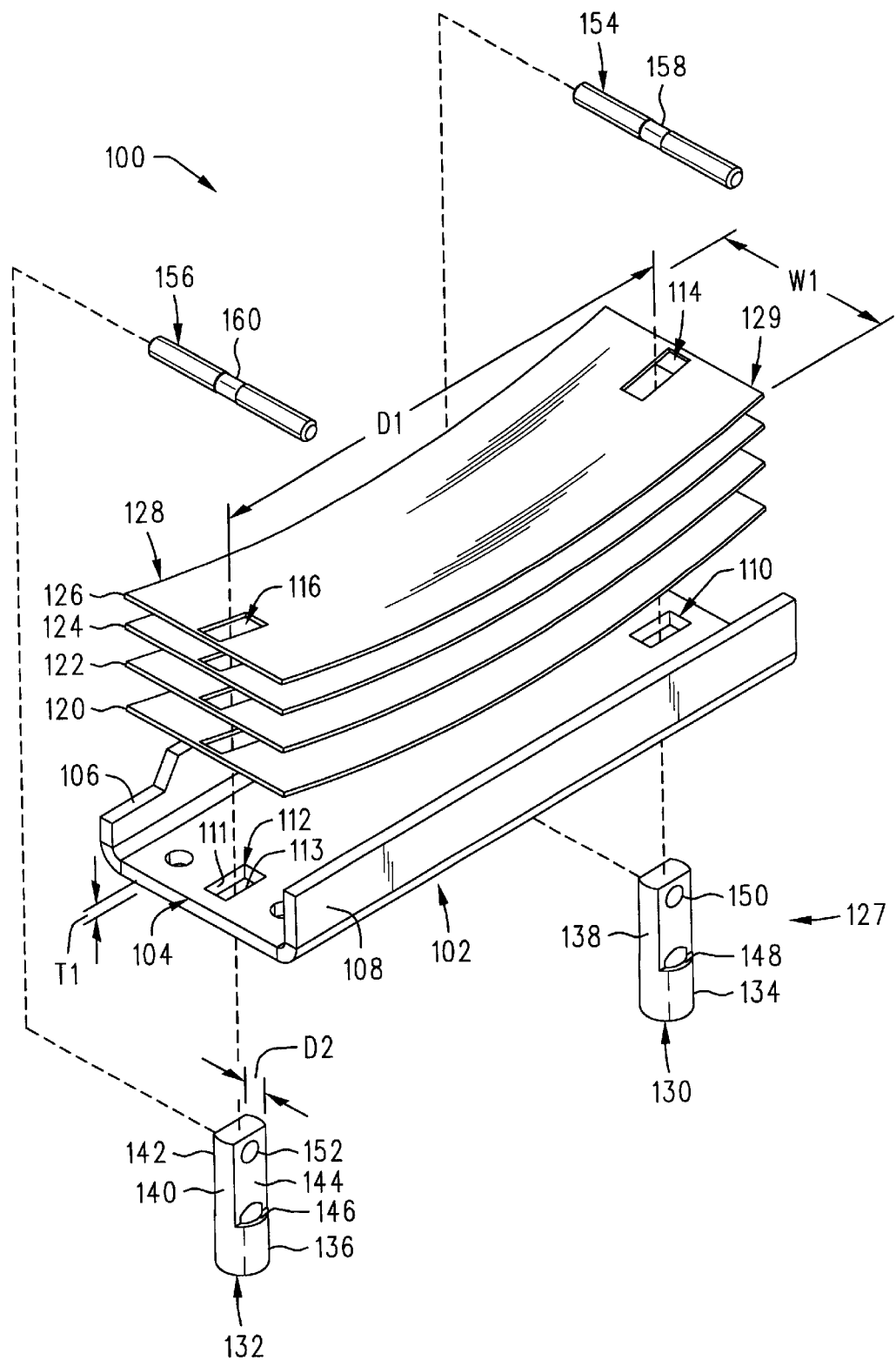
FIG. 4 is an exploded isometric view of the spring-loaded backing plate of FIG. 2.
Figure 5:
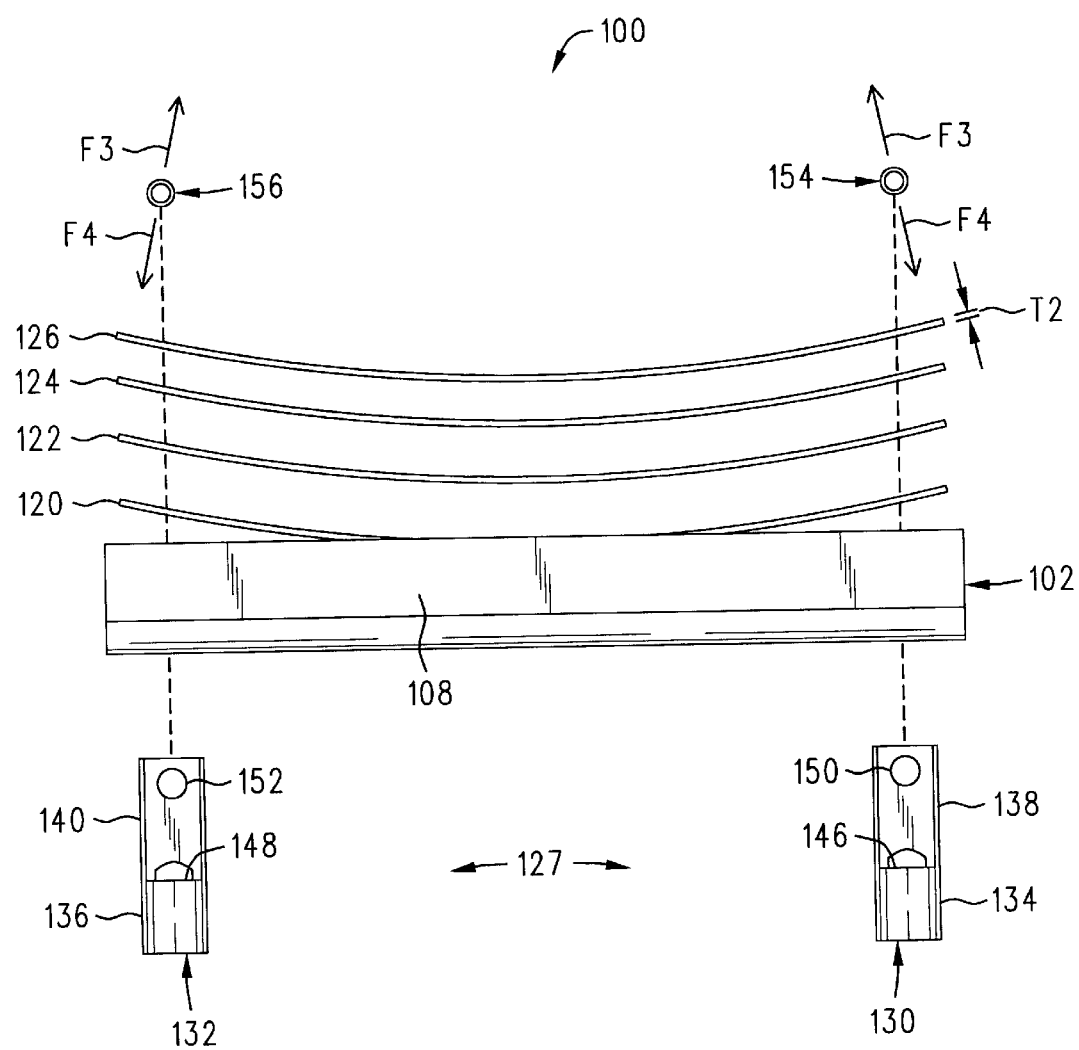
FIG. 5 is an exploded side view of the spring-loaded backing plate of FIG. 4.

FIGS. 4 and 5 illustrate the spring-loaded backing plate assembly 100 of the present invention. The assembly 100 may include a backing plate 102 which is preferably constructed from a rigid, sturdy material such as aluminum or steel. The backing plate 102 has a sufficient thickness "T1" to provide a solid support surface for the printed circuit board 52 (FIGS. 2 and 3). For example, the thickness "T1" of the backing plate 102 may be on the order of 0.06 inches. The backing plate 102 may comprise a channel portion 104 which may be relatively U-shaped in cross-section and which is formed by a pair of retaining walls 106, 108. The retaining walls 106, 108 assist in keeping the springs 120, 122, 124, 126 in place against the backing plate 102 and greatly increase the stiffness of the backing plate 102. As noted above, the backing plate 102 may further comprise a pair of openings 110, 112 extending laterally therethrough which are adapted to receive posts 130, 132 (which may be internally-threaded as noted above and shown in a break-away portion of post 132 in FIG. 5).

As shown in FIGS. 4 and 5, the assembly 100 may further comprise one or more leaf springs 120, 122, 124, 126, which will be described in further detail below. The leaf springs 120, etc., provide a force "F3" (FIG. 5) which compresses the printed circuit board 52, electrical connector 70, and land grid array-type device 60 together, thereby maintaining electrical contact therebetween. As shown in FIG. 3, the distance "L2" required by the springs (shown compressed) is considerably smaller than that required for comparable coil springs, thereby creating a compact assembly.

The backing plate assembly 100 may further comprise a retainer assembly 127 which functions to retain the leaf springs 120, etc. against the backing plate 102 in a preloaded state and to transfer the compressive force "F3" exerted thereby to the printed circuit board 52, the electrical connector 70, and the land grid array-type device 60 (FIGS. 2 and 3). The retainer assembly 127 may comprise a pair of posts 130, 132 and a pair of pins 154, 156 extending laterally therethrough, which are each described in further detail below. While a pair of posts 130, 132 and a pair of pins 154, 156 are shown and described herein, it is to be understood that a single post/pin assembly may be used, whereby the leaf springs 120, etc. would be cantilever springs, with one end thereof fixedly attached to the backing plate 102. However, in a preferred embodiment, the retainer assembly 127 is comprised of at least one, and possibly a plurality, of pairs of posts and pins.

As shown in FIG. 4, the leaf springs 120, 122, 124, 126 may each comprise generally rectangular openings 114, 116 extending laterally therethrough which align with the generally rectangular openings 110, 112 in the backing plate 102. The openings 114, 116 may be positioned at opposite end portions 128, 129 of the leaf springs 120, etc. in order to provide the maximum spring force "F3" (FIG. 5). Each of the posts 130, 132 (FIGS. 4 and 5) may comprise a cylindrical lower portion 134, 136 and an upper portion 138, 140 with at least one substantially flat surface (e.g., 142, 144). The upper portion 138, 140 of each post 130, 132 is adapted to extend through the generally rectangular openings 110, 112, 114, 116 in the backing plate 102 and leaf springs 120, etc. Providing one or more substantially flat surfaces 142, 144 on each post, e.g., 132, and one or more substantially flat surfaces 111, 113 on the openings, e.g., 110, in the backing plate 102 prevents the posts 130, 132 from rotating in the openings when the backing plate assembly 100 is assembled. A shelf portion, 146, 148 is formed on each post 130, 132 between the cylindrical lower portion 134, 136 and upper portion 138, 140 of each post 130, 132. This shelf portion 146 provides a "stop", i.e., the shelf portion 146 prevents the posts 130, 132 from slipping through the openings 110, 112, etc. due to the force "F3" (FIG. 5) exerted by the leaf springs 120, etc. This "stop" function, in combination with the function of the pins 154, 156 described below, allows the leaf springs 120, etc. to be preloaded in the spring-loaded backing plate assembly 100.

The posts 130, 132 may further comprise openings 150, 152 extending laterally through the upper portion 138, 140 of each post. The openings 150, 152 may be generally circular in cross-section and are adapted to receive a pair of pins 154, 156. As shown in FIG. 4, the pins 154, 156 may each comprise a recessed center portion 158, 160, respectively, which has a cross-sectional diameter slightly less than the cross-sectional diameter of the non-recessed portion of the pin. The center portion 158, 160 of each pin may extend at least the length, or preferably slightly longer than, the length "D2" of the opening (e.g., 152) in each post (e.g., 132) as shown in FIG. 4. The force "F3" (FIG. 5) exerted by the springs 120, etc. pushes the recessed center portion 158, 160 (FIG. 4) of the pins 154, 156 up against the openings 150, 152 in the posts 130, 132, thereby acting to retain the pins 154, 156 in the posts 130, 132.

There are three important considerations in determining the specific dimensions of each leaf spring 120, 122, 124, 126 (FIGS. 3 and 4). First, as described above, springs used in this application preferably have a low spring constant "K". Second, in the interest of downsizing components for today's densely-packed electronics, the surface area or "footprint" of the backing plate 102 used to hold the leaf springs is preferably not much larger than the surface area of a land grid array (e.g., 72, FIG. 2). Third, the stress exerted on the spring due to bending must be kept below the maximum bending stress tolerated by the spring. As a result of the above considerations, the leaf springs 120, 122, 124, 126 are preferably relatively thin, e.g., the thickness "T2" (FIG. 4) of each spring may be approximately 0.015 inches. The distance "D1" (FIG. 4) between the openings 114, 116 (measured from the center of each opening) may be, e.g., 1.8 inches. The width "W1" of each leaf spring 120, etc. may be, e.g., 0.6 inches. Typically, a relatively large force, e.g., on the order of 40 to 200 lbs., is required in this type of application. By stacking a plurality of relatively thin leaf springs 120, 122, 124, 126 in parallel as shown in FIGS. 3 and 4, a relatively large force "F3" is provided to oppose the anti-compressive force "F2" (FIG. 2) generated by the pads 72, 74 on the electrical connector 70 (FIGS. 1 and 2). Specifically, since each leaf spring 120, etc. deflects approximately the same distance, the force provided by each leaf spring is approximately the same. When leaf springs are stacked in parallel, these forces are added together. For example, should 40 lbs. of force be required to maintain electrical connection between the printed circuit board 52, electrical connector 70, and land grid array-type device 60, four leaf springs 120, 122, 124, 126 with the above dimensions may be utilized, each leaf spring having a spring constant of approximately 100 lbs/inch and providing approximately 10 lbs. of force.

Figure 6:
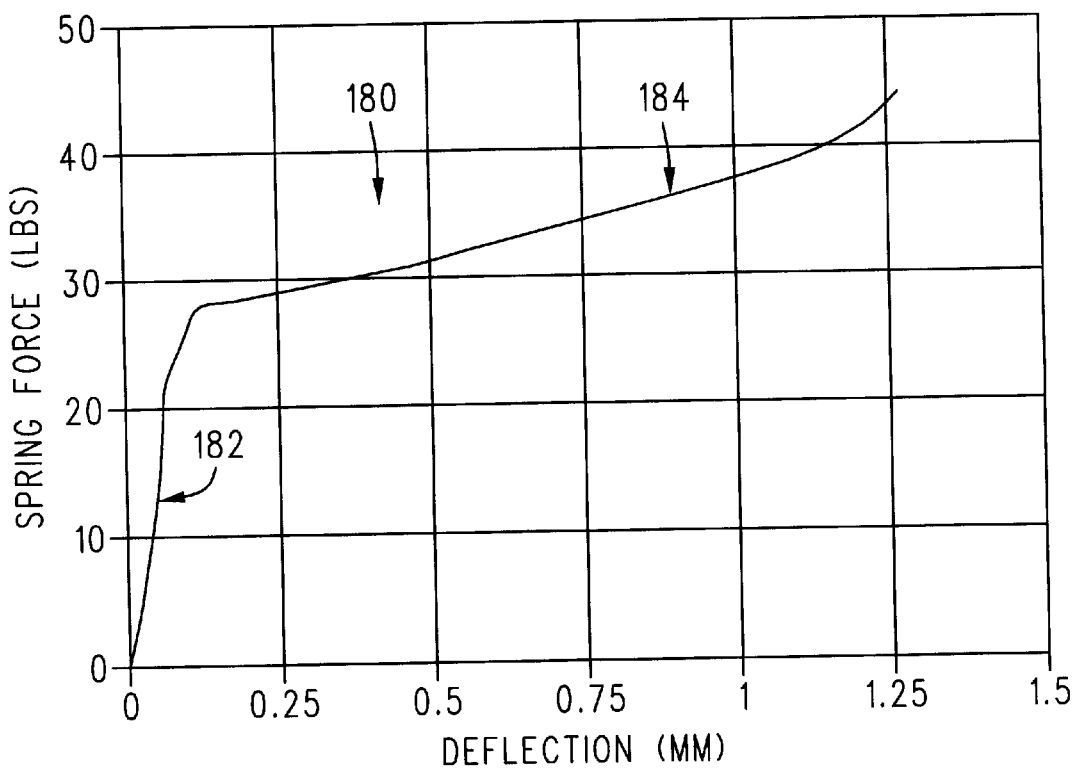
FIG. 6 is a graph illustrating the relationship between spring deflection and the amount of force exerted by the springs in the spring-loaded backing plate of FIG. 4.

FIG. 6 illustrates the relationship between spring deflection and the amount of force exerted by the springs. In this example, all four springs 120, 122, 124, 126 were used in parallel. The first, steep portion 182 of the curve 180 represents transferring the preloaded compressive force of the springs 120, 122, 124, 126 to the printed circuit board 52, the electrical connector 70, and the land grid array-type device 60 as described in further detail below with reference to FIG. 7. As shown in FIG. 6, the springs 120, etc. utilized in this example exert approximately 28 lbs. of force when in a preloaded state. The second, flatter portion 184 of the curve 180 represents further compression of the springs 120, etc. as the spring-loaded backing plate assembly 100 is being assembled onto a circuit assembly 50 (FIGS. 2 and 3).

Figure 7:
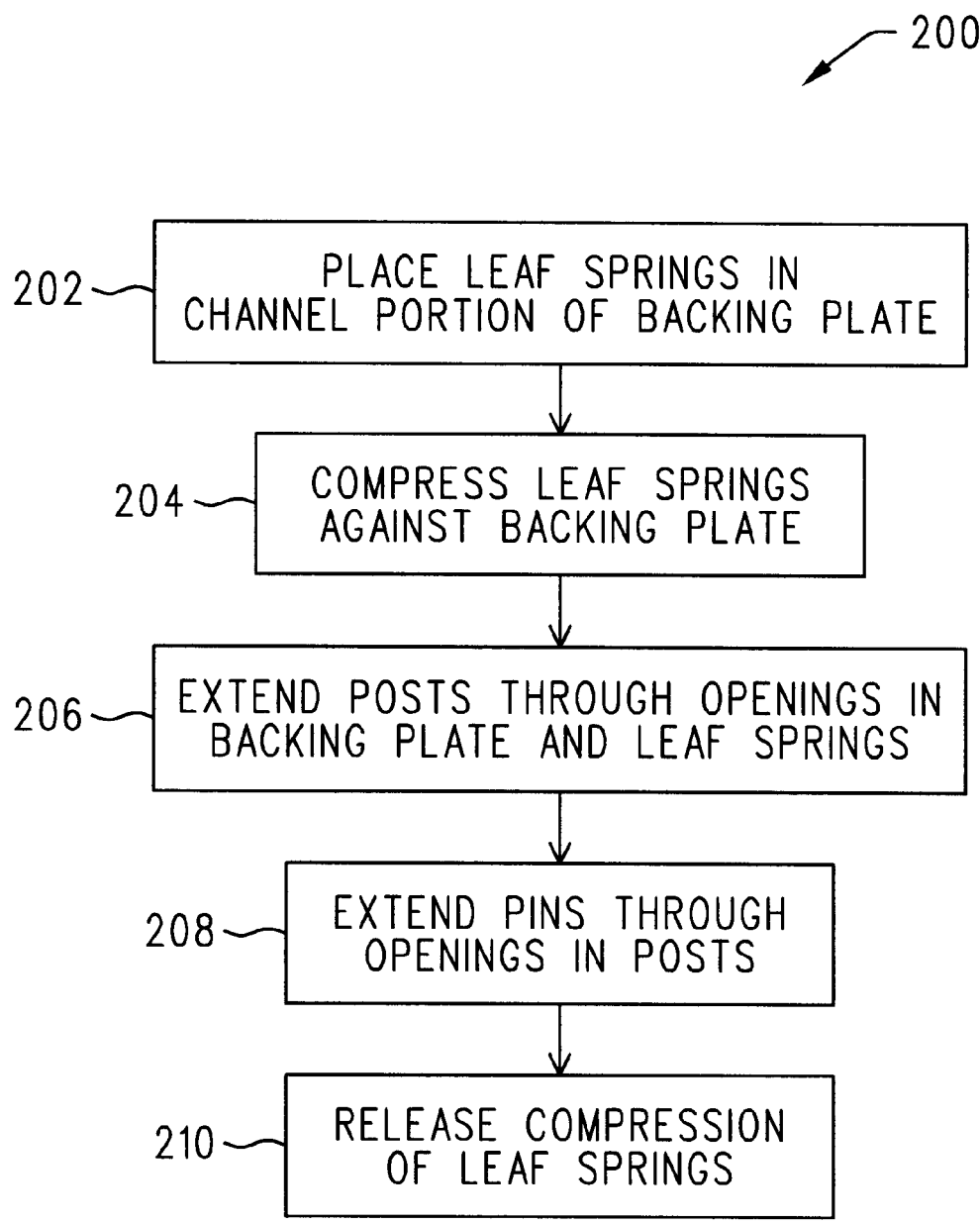
FIG. 7 is a flow chart illustrating a method for assembling the spring-loaded backing plate of the present invention.

With reference to FIGS. 2–5, a method 200 for assembling the spring-loaded backing plate assembly 100 is shown in FIG. 7. The first step 202 of the method 200 is to place the leaf springs 120, 122, 124, 126 on the backing plate 102 (specifically, in the channel portion 104 thereof). The next step 204 is to compress the leaf springs 120, etc. against the backing plate 102 using an arbor press-type mechanism (well-known in the art) or the like. The next step 206 is to extend the posts 130, 132 through the openings 110, 112, 114, 116 in the backing plate 102 and the leaf springs 120, etc. The next step 208 is to extend the pins 154, 156 through the openings 150, 152 in the posts 130, 132. The final step 210 is to release the compression of the leaf springs 120, etc. At this point, the spring-loaded backing plate assembly 100 is in a preloaded state. When the springs are released from the arbor press-type mechanism, the spring force "F3" (FIG. 5) pushes the recessed center portion 158, 160 (FIG. 4) of the pins 154, 156 up against the openings 150, 152 in the posts 130, 132, thereby acting to retain the pins 154, 156 in the posts 130, 132. The pins 154, 156, being constrained within the openings 150, 152, in the posts, exert a counter-force "F4" (FIG. 5) against the springs 120, etc., thereby holding the springs 120, etc. on the posts 130, 132 and against the backing plate 102.

Figure 8:
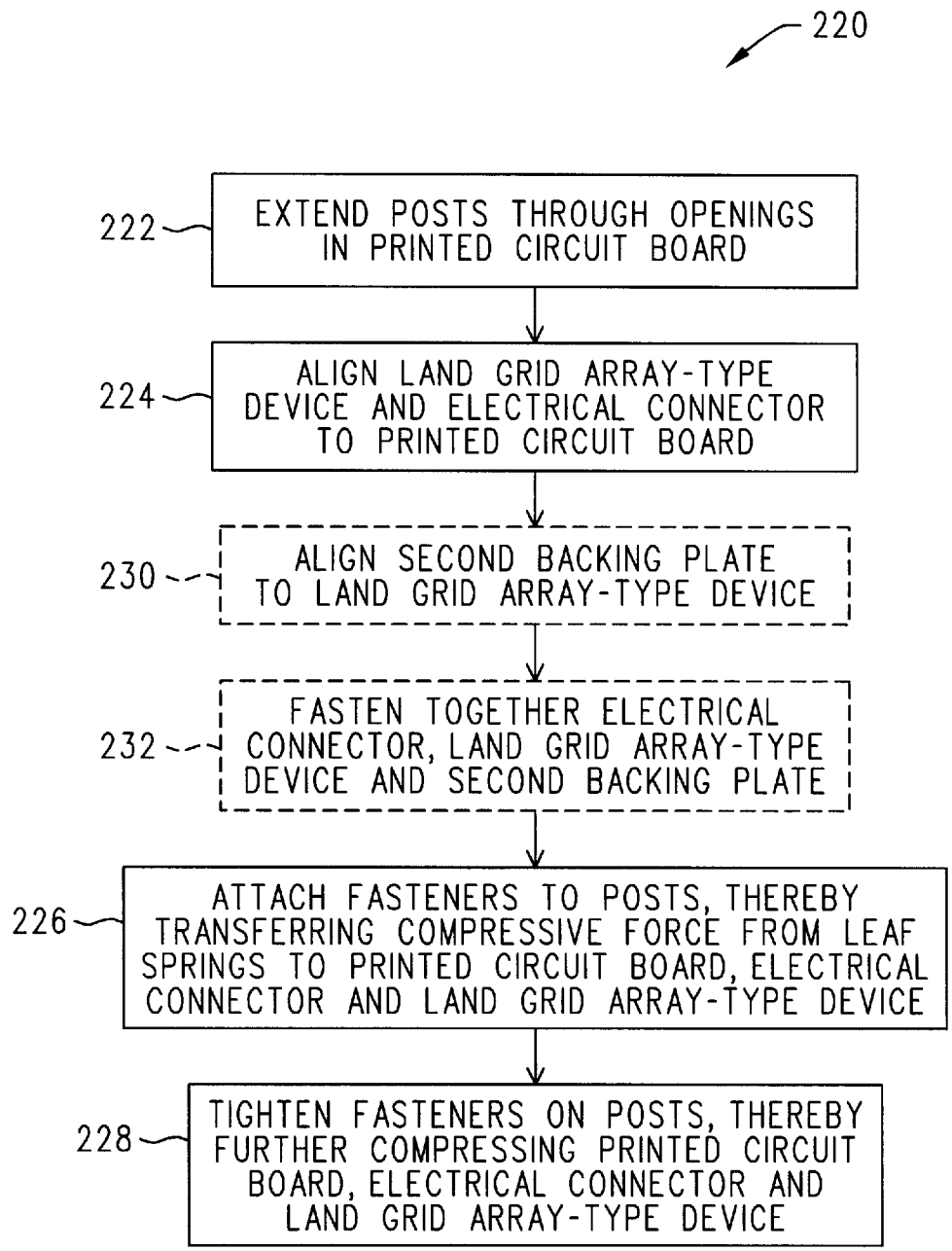
FIG. 8 is a flow chart illustrating a method for assembling a circuit assembly utilizing the spring-loaded backing plate of the present invention.

A method 220 for assembling a circuit assembly 50 utilizing a spring-loaded backing plate assembly 100 is illustrated in FIG. 8, with reference to FIGS. 2–5. The first step 222 of the method 220 is to extend the posts 130, 132 through the openings 96, 97 in the printed circuit board 52 (FIG. 2). As noted above, an insulator 83 may be positioned between the printed circuit board 52 and spring-loaded backing plate 100 prior to completion of this step. The spring force "F3" (FIG. 5), being generally perpendicular to the openings 114, 116 (FIG. 4) in the springs 120, etc., also causes the posts 130, 132 to tilt toward one another at the upper portion 138, 140, thereof and away from one another at the lower portion 134, 136 thereof when the springs 120, etc. are released. The tilt in the posts 130, 132 retains the spring-loaded backing plate assembly 100 against the printed circuit board 52 without the use of any screws or other fasteners. However, at this point, the spring-loaded backing plate assembly 100 may be secured to the printed circuit board 52 with screws 170, 172 (FIG. 2) or the like, and the following steps 224–228 of the method 200 may be completed at a future date. Also, even without screws or the like, the tilt in the posts 130,132 holds the spring-loaded backing plate assembly 100 in place against the printed circuit board 52 as the following steps 224–228 of the method 200 are completed.

The next step 224 of the method 200 is to align the land grid array-type device 60 and the electrical connector 70 with the printed circuit board 52. The next step 226 of the method 200 is to attach each fastener 84, 85 to each of the internally-threaded posts 130, 132, thereby transferring the compressive force "F3" from the leaf springs 120, 122, 124, 126 to the printed circuit board 52, electrical connector 70, and land grid array-type device 60. The next step 228 of the method 200 is to tighten each fastener 84, 85 on each of the posts 130, 132, thereby further compressing the printed circuit board 52, electrical connector 70, and land grid array-type device 60. As the fasteners 84, 85 are tightened, the force "F4" (FIGS. 2 and 5) of the pins 156, 158 pushing against the leaf springs 120, etc. attempts to flatten the leaf springs 120, 122, 124, 126. The leaf springs 120, etc., resist this flattening force "F4" and exert a counter-force "F3" to the pins 154, 156 which is translated through the posts 130, 132 to compress the board 52, connector 70 and device 60 together. The fasteners 84, 85 may be tightened on the posts 130, 132 until the bottom surface 131 of each of the posts 130, 132 contacts the bottom surface 79 of the second backing plate 80 (or heat sink, etc.) in order to provide the proper predetermined compressive force. It will be appreciated by those skilled in the art that the connector assembly 81 (i.e., the fasteners 84, 85 and posts 130, 132) allows the leaf springs 120, etc. to provide a predetermined, constant force upon every installation of the spring-loaded backing plate assembly 100 in a circuit assembly 50. Specifically, the fasteners 84, 85 are preferably captive screws which are adapted to be screwed into the posts an adequate number of threads to get a hold thereon before any preload of the springs is transferred to the printed circuit board 52, electrical connector 70, and land grid array-type device 60 (as well as the second backing plate 80 and insulators 82, 83, if present). As the fasteners 84, 85 are screwed into the posts 130, 132 after the preload has been transferred, the leaf springs 120, 122, 124, 126 are flattened and the various components are compressed together. The fasteners 84, 85 are tightened until the bottom surface 131 of each of the posts 130, 132 abuts the bottom surface 79 of the second backing plate 80 (or heat sink, etc.). In other words, the posts 130, 132 "bottom out" on the second backing plate 80. Since no further tightening may be done without applying excessive torque when the posts "bottom out", an installer knows that the proper predetermined compressive force has then been reached.

The method 200 may comprise the further step 230 of, prior to the step 226 of attaching the fasteners 84, 85 to the posts 130, 132, aligning a second backing plate 80 (FIG. 2) with the land grid array-type device 60. As noted above, the second backing plate 80 may be part of a heat sink (not shown) or the like which includes a stiff plate member. It will be appreciated by those skilled in the art that the backing plate 102 on the spring-loaded backing plate assembly and the second backing plate 80 co-act to spread the compressive force "F3" (FIG. 5) fairly evenly across the electrical connector 70.

The method 200 may comprise the further step 232 of, prior to the step 226 of attaching the fasteners 84, 85 to the posts 130, 132, fastening together the electrical connector 70, land grid array-type device 60, and second backing plate 80 (including an insulator 82, if present). Specifically, fasteners 98, 99 such as pronged pins or the like may be utilized in order to snap these components together into a single unit prior to installing them onto the printed circuit board 52. Thus, the present invention provides a quick and easy method for assembling a circuit assembly 50 by using a printed circuit board 52 and only two other units: the spring-loaded backing plate assembly and the connector/device unit described above.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

We claim:

1. A spring-loaded backing plate assembly for use with a printed circuit board, an electrical connector, and a land grid array-type device, comprising:
   a) a backing plate disposed between and directly abutting said printed circuit board and at least one leaf spring;
   b) said at least one leaf spring which exerts compressive force;
   c) a retainer assembly connected to said leaf spring which holds said leaf spring in a preloaded state against said backing plate, whereby said compressive force exerted from said leaf spring is retained by said spring-loaded backing plate assembly until said retainer assembly is connected to said printed circuit board, said electrical connector, and said land grid array-type device, thereby transferring said compressive force from said leaf spring to said printed circuit board, said electrical connector, and said land grid array-type device.

2. The spring-loaded backing plate assembly of claim 1, said backing plate further comprising a channel portion formed by a plurality of retaining walls extending from said backing plate.

3. The spring-loaded backing plate assembly of claim 1, wherein said backing plate comprises at least one opening and said leaf spring comprises at least one opening, said retainer assembly comprising:
   a) at least one post extending laterally through said opening in said backing plate and said opening in said leaf spring, said post comprising an opening extending laterally therethrough; and
   b) a pin extending laterally through said opening in said post, said pin abutting said leaf spring thereby retaining said leaf spring on said post and holding said leaf spring against said backing plate.

4. The spring-loaded backing plate assembly of claim 3, wherein:
   a) said post comprises a generally cylindrically-shaped lower portion, an upper portion comprising at least one substantially flat surface and a shelf portion formed between said lower portion and said upper portion; and
   b) said pin comprises a recessed center portion extending along said pin a distance which is at least the length of said opening in said post.

5. The spring-loaded backing plate assembly of claim 4, wherein:
   a) said upper portion of said post has a generally rectangular-shaped cross section; and
   b) said opening in said backing plate is generally rectangular.

6. A circuit assembly comprising:
   a) a printed circuit board;
   b) a land grid array-type device;
   c) an electrical connector disposed between said printed circuit board and said land grid array-type device;
   d) a spring-loaded backing plate assembly, comprising:
      i) a backing plate disposed between and directly abutting said printed circuit board and at least one leaf spring;
      ii) said at least one leaf spring which exerts compressive force; and
      iii) a retainer assembly connected to said leaf spring which holds said leaf spring in a preloaded state against said backing plate, whereby said compressive force exerted from said leaf spring is retained by said spring-loaded backing plate assembly until said retainer assembly is connected to said printed circuit board, said electrical connector, and said land grid array-type device, thereby transferring said compressive force from said leaf spring to said printed circuit board, said electrical connector, and said land grid array-type device;
   e) a connector assembly extending through said backing plate and said leaf spring of said spring-loaded backing plate assembly, said printed circuit board, said electrical connector, and said land grid array-type device, said connector assembly comprising:
      i) said retainer assembly of said spring-loaded backing plate assembly; and
      ii) at least one fastener connecting said retainer assembly to said printed circuit board, said electrical connector, and said land grid array-type device.

7. The circuit assembly of claim 6, said backing plate further comprising a channel portion formed by a plurality of retaining walls extending from said backing plate.

8. The circuit assembly of claim 6, wherein said backing plate comprises at least one opening and said leaf spring comprises at least one opening, said retainer assembly comprising:
   a) at least one post extending laterally through said opening in said backing plate and said opening in said leaf spring, said post comprising an opening extending laterally therethrough; and
   b) a pin extending laterally through said opening in said post, said pin abutting said leaf spring thereby retaining said leaf spring on said post and holding said leaf spring against said backing plate.

9. The circuit assembly of claim 8, wherein:
   a) said post comprises a generally cylindrically-shaped lower portion, an upper portion comprising at least one substantially flat surface, and a shelf portion formed between said lower portion and said upper portion; and
   b) said pin comprises a recessed center portion extending along said pin a distance which is at least the length of said opening in said post.

10. The circuit assembly of claim 9, wherein:
    a) said upper portion of said post has a generally rectangular-shaped cross section; and
    b) said opening in said backing plate is generally rectangular.

11. The circuit assembly of claim 8, wherein said post is internally-threaded and said fastener is comprised of a threaded screw.

12. The circuit assembly of claim 11 wherein said threaded screw is a captive screw.

13. The circuit assembly of claim 6 further comprising a second backing plate positioned adjacent to said land grid array-type device.

14. A method for assembling a spring-loaded backing plate assembly for use with a printed circuit board, an electrical connector, and a land grid array-type device, said assembly comprising a backing plate, at least one leaf spring, at least one post, and at least one pin, said method comprising:

a) placing said leaf spring on said backing plate;

b) compressing said leaf spring against said backing plate;

c) extending said post through said backing plate and said leaf spring;

d) extending said pin through said post; and e) releasing the compression of said leaf spring.

15. A method for assembling a circuit assembly utilizing a spring-loaded backing plate assembly comprising at least one post, at least one leaf spring, and a retainer assembly, said circuit assembly comprising a printed circuit board, a land grid array-type device, an electrical connector, and a connector assembly comprising said post and at least one fastener connecting said retainer assembly to said printed circuit board, said land grid array-type device, and said electrical connector, said method comprising:

a) extending said post through said printed circuit board;

b) aligning said land grid array-type device and said electrical connector to said printed circuit board;

c) attaching said fastener to said post, thereby transferring compressive force from said leaf spring to said printed circuit board, said electrical connector, and said land grid array-type device; and d) tightening said fastener on said post, thereby further compressing said printed circuit board, said electrical connector, and said land grid array-type device.

16. The method of claim 15 further comprising, prior to the step of attaching said fastener to said post, aligning a second backing plate to said land grid array-type device.

17. The method of claim 16 further comprising, prior to the step of attaching said fastener to said post, fastening together said electrical connector, said land grid array-type device, and said second backing plate.

* * * * *